United States Patent
Onishi et al.

(10) Patent No.: US 7,611,747 B2
(45) Date of Patent: Nov. 3, 2009

(54) INSULATING MATERIAL, METHOD FOR PRODUCING INSULATING MATERIAL, METHOD FOR MANUFACTURING MULTILAYER CIRCUIT BOARD

(75) Inventors: Kazuyuki Onishi, Kawasaki (JP); Toshiyasu Matsui, Kawasaki (JP); Hiroshi Kurakata, Kawasaki (JP); Masahiko Sugimura, Kawasaki (JP)

(73) Assignee: Zeon Corporation, Tokyo (JP)

( * ) Notice: Subject to any disclaimer, the term of this patent is extended or adjusted under 35 U.S.C. 154(b) by 0 days.

(21) Appl. No.: 10/240,215

(22) PCT Filed: Mar. 30, 2001

(86) PCT No.: PCT/JP01/02797

§ 371 (c)(1),
(2), (4) Date: Sep. 30, 2002

(87) PCT Pub. No.: WO01/74125

PCT Pub. Date: Oct. 4, 2001

(65) Prior Publication Data

US 2003/0110630 A1    Jun. 19, 2003

(30) Foreign Application Priority Data

| Mar. 30, 2000 | (JP) | 2000-95894 |
| May 30, 2000 | (JP) | 2000-160050 |
| Jun. 16, 2000 | (JP) | 2000-181175 |

(51) Int. Cl.
*B05D 5/12* (2006.01)

(52) U.S. Cl. .......... 427/97.6; 427/58; 427/96.1; 427/97.1; 427/379; 428/323; 428/457; 428/458

(58) Field of Classification Search .............. 427/372.2, 427/379, 385.5; 428/323, 457; 29/856
See application file for complete search history.

(56) References Cited

U.S. PATENT DOCUMENTS

| 3,888,728 | A | | 6/1975 | Petrik et al. .................. 162/167 |
| 5,114,754 | A | * | 5/1992 | Cronin et al. ................ 427/333 |
| 5,298,288 | A | * | 3/1994 | Curry et al. .................. 427/379 |
| 6,346,581 | B1 | * | 2/2002 | Tsunogae et al. ......... 525/332.1 |
| 6,955,848 | B2 | * | 10/2005 | Wakizaka et al. ........... 428/209 |

FOREIGN PATENT DOCUMENTS

| EP | 0 377 332 | A2 | 7/1990 |
| EP | 0 488 705 | A1 | 6/1992 |
| EP | 0488705 | A1 | 6/1992 |
| JP | 4279341 | A | 10/1992 |
| JP | 5-4240 | A | 1/1993 |
| JP | 7-233265 | | 9/1995 |
| JP | 8018196 | A | 1/1996 |
| JP | 9-70841 | A | 3/1997 |
| JP | 9-321441 | | 12/1997 |
| JP | 10-106789 | | 4/1998 |
| JP | 10-258438 | | 9/1998 |
| JP | 10-265594 | | 10/1998 |
| JP | 11-58425 | A | 3/1999 |
| JP | 11166137 | A | 6/1999 |
| JP | 11291247 | A | 10/1999 |
| JP | 11348186 | A | 12/1999 |
| JP | 2000-42470 | | 2/2000 |

* cited by examiner

*Primary Examiner*—Monique R Jackson
(74) *Attorney, Agent, or Firm*—Birch, Stewart, Kolasch & Birch, LLP

(57) ABSTRACT

This invention provides a material for a multi-layer circuit board, excellent in insulating property and burying properties and free from occurrence of cracks, a production method, and a multi-layer circuit board using the insulating material. The invention provides an insulating material having a curable composition layer wherein the curable composition layer contains 0 to 50 pieces/cm$^2$ of foreign matter having particle sizes falling within a range of 30 to 50 μm, a production method, and a production method for a multi-layer circuit board using the insulating material.

6 Claims, 1 Drawing Sheet

INSULATING MATERIAL, METHOD FOR PRODUCING INSULATING MATERIAL, METHOD FOR MANUFACTURING MULTILAYER CIRCUIT BOARD

This application is the national phase under 35 U.S.C. § 371 of PCT International Application No. PCT/JP01/02797 which has an International filing date of Mar. 30, 2001.

TECHNICAL FIELD

This invention relates to an insulating material suitable as a material for a multi-layer circuit board, its production method and a production method for a multi-layer circuit board using the insulating material.

BACKGROUND ART

A general approach to achieve a higher density circuit board is to fabricate a multi-layer circuit board by stacking circuit boards in multiple layers. The multi-layer circuit board is generally fabricated by the steps of ① stacking an electrically insulating layer (2) on an internal layer board having formed thereon an electrically insulating layer (1) and a conductor circuit (1), that is formed on the surface of the electrically insulating layer, on a conductor circuit formation surface of the internal layer board, ② forming a conductor layer (2) on the electrically insulating layer (2) and, ③ if necessary, stacking the electrically insulating layers and the conductor circuits in several stages. Further, this method includes the step of ④ forming through-holes and via-holes and embedding an electrically conductive material in these holes to electrically connect the conductor circuits, inside the multi-layer circuit board, with one another.

If foreign matter such as dust and dirt exist in the production process of the multi-layer circuit board, they impede the formation of the through-holes and the via-holes, and it often becomes impossible to stack the electrically insulating layers and the conductor circuits at a high density. Therefore, the production process of the multi-layer circuit board has been carried out, in the past, inside a clean room, for example, lest dust and dirt adhere to the surface of the multi-layer circuit board.

A technology for achieving a higher density has been required for recent multi-layer circuit boards so as to allow reduction of size and weight and higher functions of electronic devices used with the multi-layer circuit boards. At present, the thickness of the electrically insulating layer of not greater than 0.1 mm per layer and a wiring density of not greater than 0.05/0.05 mm in connection with wiring width/wiring gap have been required. To accomplish this object, it is necessary to achieve a process for miniaturizing wiring at a higher level of accuracy and to provide laminate layers having higher flatness and higher adhesion.

In the production of multi-layer circuit boards, however, removal of foreign matters having a particle size of 30 to 50 μm or below has scarcely been taken into consideration. It has been known that when an insulating material produced under such an environment is employed, the formation of wiring having a miniature structure or the formation of the through-holes and the via-holes becomes more difficult as the wiring gap and the diameter of the through-holes or the vial-holes become smaller, an electrically conductive material cannot completely be filled into the through-holes or the via-holes, and stacking of layers with high adhesion and high flatness becomes difficult. Even when the stacking operation of the insulating films is carried out in a clean environment in which a level of particles floating in air is managed, conduction defect in minute circuit patterns or undesirable short-circuits, that may presumably result from the admixture of the foreign matter, occurs.

On the other hand, a solution casting method that applies a solution of a curable resin composition containing a curable resin to a support and then removes a solvent is generally known as a method of forming the electrically insulating material.

It is also known that various factors such as an evaporation speed of the solvent, an ambient temperature and humidity, a concentration of the resin solution and the coating thickness remarkably affect the properties of the film obtained by this solution casting method. Therefore, attempts have been made in the past to variously regulate these factors in order to obtain films having excellent properties.

For example, (1) Japanese Unexamined Patent Publication (Kokai) No. 3-316380 proposes a method that arranges a planar heat generating member below a support inside a room temperature drying zone extending from a coating portion to a drying zone inside an oven, and supplies heat from the planar heat generating member. In a production method of a film involving the steps of applying a polymer material to a support at a coating portion, conveying the support to a drying zone spaced apart by a predetermined distance from the coating portion, and evaporating a solvent inside the drying zone to form a film, (2) Japanese Unexamined Patent Publication (Kokai) No. 9-70841 describes a production method of a film that arranges at least one temperature sensor for a non-dried coating film on the support and forms the film while the temperature of the non-dried coating film is measured. These methods are directed to solve the problem that latent heat of evaporation of the solvent after coating but before drying of the solvent deprives the non-dried coating film applied, as well as the support, of heat and invites a drastic drop of the temperature with the result that the moisture in the room temperature atmosphere dews on the surface of the non-dried coating film and the surface of the coating film changes to a condition like that of ground glass, thereby deteriorating the transparency of the film. In a solution casting method for producing a film from a polymer solution by casting a polymer solution dissolved in an organic solvent to a support consisting of a traveling endless belt or a drum surface to form a film, and then drying the film, (3) Japanese Unexamined Patent Publication (Kokai) No. 11-58425 conducts first stage drying by blowing, in the drying step, drying air at a velocity of 0.1 to 2.0 m/sec onto the film formed on the support by casting until the temperature reaches a gelling temperature so set as to correspond to the components of the polymer solution, and then conducts second stage drying for more quickly drying the film after the film reaches the temperature of completion of gelling. This solution casting method for forming the film divides the drying step into two steps and regulates the velocity of drying air for each drying step so as to suppress an adverse influence on flatness of the film due to variance of drying of the film and the drop of quality, and to improve productivity.

Among the known methods described above, the methods (1) and (2) do not take the drying condition, such as the drying temperature and the drying time inside the drying zone, into consideration, and are not sufficient to obtain an insulating film having superior flatness. The method (3) divides the drying step into two steps, pays a specific attention to management of the velocity of the drying air in the drying step and can suppress deterioration of flatness of the film due to variance of drying of the film. However, this method does not sufficiently consider the drying temperature and the drying time in the drying step, and its effect is not entirely sufficient. Furthermore, this method cannot easily provide an insulating material having a low content of foreign matter and bubbles.

In view of the problems described above, this invention aims at providing an insulating material with a low content of foreign matter and bubbles, that reduces the number of insulation defects and conduction defects, and is suitable for providing a multi-layer circuit board excellent in flatness, and a production method for such an insulating material.

DISCLOSURE OF THE INVENTION

According to the invention, there is provided an insulating material including a support and a curable composition layer laminated on the support, wherein the curable composition layer has a content of foreign matter having particle sizes within the range of 30 to 50 μm of 0 to 50 pieces per $cm^2$, and a charged voltage (absolute value) of not higher than 500 V. Incidentally, the term "foreign matter" used in the invention represents micro-particulate impurities contained in the curable composition layer of the insulating material, and capable of being observed through an optical microscope.

According to the invention, there is also provided a method of producing an insulating material having a support and a curable composition layer laminated on the support, the method including the steps of forming a coating layer from a solution of a curable composition on a support and drying the coating layer, wherein the curable composition layer has a content of foreign matter having particle sizes within the range of 30 to 50 μm of 0 to 50 pieces per $cm^2$, or a method of producing an insulating material having a support and a curable composition layer laminated on the support, the method including the steps of forming a coating layer from a solution of a curable composition on a support and drying the coating layer, wherein the drying step of drying the coating layer includes at least a first drying zone for conducting drying at 20 to 90° C. and a second drying zone for conducting drying at 70 to 150° C., a drying time of each of the drying zones is 40 to 150 seconds, and a temperature of the second drying zone is higher than that of the first drying zone.

According to the invention, there is further provided a method of producing a multi-layer circuit board comprising the steps of laminating insulating material described above on an internal layer board having the insulating layer (1) and a conductor circuit (1) formed on a surface of the insulating layer (1), in such a fashion that the curable composition layer comes into contact with the internal layer board; removing the support; curing the curable composition layer and forming an electrically insulating layer (2); and forming a conductor layer (2) on a surface of the electrically insulating layer (2).

When the insulating material of the invention is used, it becomes possible to form minute wiring, through-holes and via-holes, to completely embed an electrically conductive material in the through-holes or the via-holes, and to produce a multi-layer circuit board excellent in adhesion, embedding property and insulating resistance and free from the occurrence of cracks.

The production method of an insulating material according to the invention can provide an insulating material having a curable composition layer, in which foreign matter having very small particle sizes, particularly foreign matter having particle sizes within the range of 30 to 50 μm, are minimized, without drastically changing the principal portions of existing production lines.

BEST MODE FOR CARRYING OUT THE INVENTION

Figure 1:
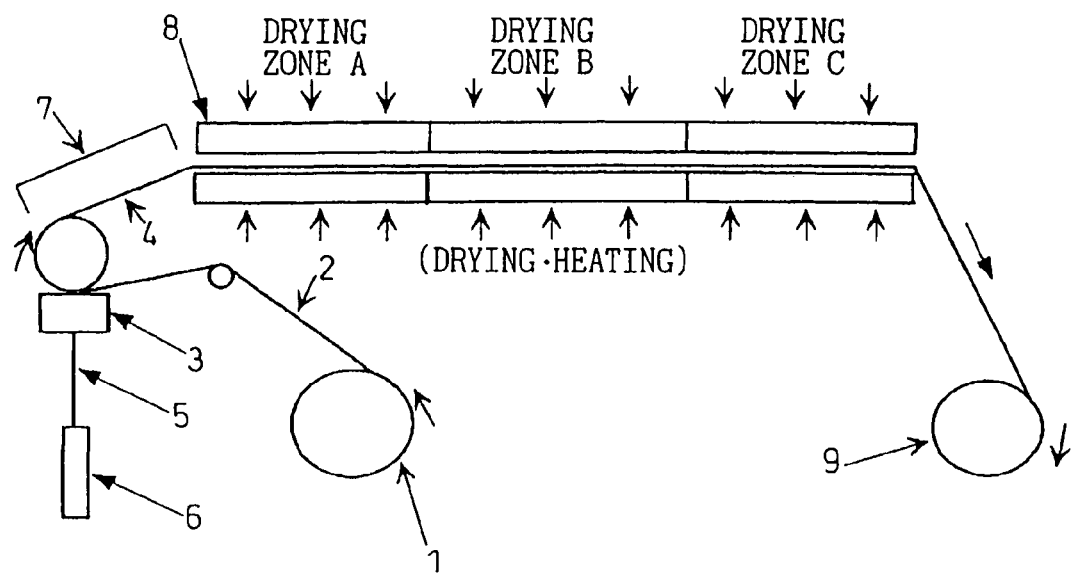
FIG. 1 is a schematic view showing production of an insulating material according to the invention by use of a continuous coating apparatus.

The insulating material according to the invention has a support and a curable composition layer formed on the support. In this curable composition layer, the content of foreign matter having particle sizes within the range of 30 to 50 μm is not greater than 50 per $cm^2$, preferably not greater than 30 and more preferably not greater than 10.

In the curable composition layer, the number of particles having sizes within the range of 10 to 30 μm is not greater than 500 per $cm^2$, preferably not greater than 300 and more preferably not greater than 100 besides the requirement described above.

Furthermore, in the curable composition layer, the number of particles having sizes within the range of 0 to 10 μm is not greater than 5,000 per $cm^2$, preferably not greater than 3,000 and more preferably not greater than 1,000, in addition to the requirements described above. The number of particles is measured by a method described in later-appearing examples.

The curable resin composition layer is not particularly limited by the dielectric constant of the cured product obtained by curing the curable resin composition. However, the curable resin composition layer generally has a dielectric constant value of not greater than 4 measured at 1 MHz in accordance with JIS C6481, preferably not greater than 3.5 and more preferably not greater 3.

In the curable resin composition layer, water absorption of the cured product obtained by curing the composition is generally 0.5% or below in terms of the value measured in accordance with JIS C6481, preferably 0.3% or below and more preferably 0.1% or below.

The curable resin composition layer has, after it is laminated on the support but before it is cured, a melt viscosity value at 120° C. of 1,000 to 100,000 in terms of a value measured by use of a Rheometric RDA-II dynamic viscoelasticity measuring instrument, preferably 5,000 to 80,000, more preferably 10,000 to 50,000 and most preferably 20,000 to 40,000 cps. When the melt viscosity value at 120° C. of the curable resin composition layer is within this range, burying property of wiring into an internal layer board and flatness after lamination are excellent and suitable.

The thickness of the curable resin composition layer is generally 10 to 200 μm, preferably 15 to 150 μm and more preferably 20 to 100 μm.

The areas of the support and the curable resin composition layer may well be the same. As the support must be peeled after it is laminated on the internal layer board, however, the area of the support is preferably somewhat greater than that of the curable resin composition layer.

The insulating material of the invention suitably has a width of 10 to 300 cm and a length of at least 1,000 cm.

The insulating material according to the invention has the support and the curable resin composition layer laminated on the support, and its charging voltage in terms of an absolute value is 500 V or below, preferably 200 V or below and more preferably 100 V or below. When the charging voltage of the insulating material is excessively great, floating particles and small particles of foreign matter are likely to adhere to the insulating material during storage, transportation or the lamination process even though the amount of the foreign matter in the curable resin composition layer is limited to a low level as described above, and the insulating property and the flatness are deteriorated.

The support that can be used for the insulating material of the invention includes a resin film and a metal foil. Ordinary thermoplastic plastic films are used as the resin film. Concrete examples include polyester films such as a polyethylene terephthalate film and a polyethylene naphthalate film, a polypropylene film, a polyethylene film, a polycarbonate film, a polyarylate film and a nylon film. Examples of the metal foil include a copper foil, an aluminum foil, a nickel foil, a chromium foil, a gold foil and a silver foil.

Additives such as an anti-blocking agent are generally added to the resin film in many cases. As the anti-blocking agent protrudes to the resin film surface, the anti-blocking agent sometimes falls off and mixes into the curable composition layer. Therefore, the resin film as the support used in the invention preferably has the minimum addition amount of the anti-blocking agent to prevent admixture of foreign matter.

The thickness of the support is not particularly limited. From the aspect of the working factor, etc, the thickness is generally 1 to 200 μm, preferably 2 to 100 μm, more preferably 3 to 75 μm and most preferably 10 to 50 μm.

The elastic modulus of the support is not particularly limited but is generally 100 to 15,000 MPa as the value measured by use of a visco-elastometer DSM6100 of Seiko Instruments, Inc, preferably 1,000 to 10,000 MPa and more preferably 3,000 to 8,000 MPa. When the elastic modulus of the support is within this range, the support and the curable composition layer hardly peel away from each other during the storage or transportation of the insulating material, the support can be easily peeled from the curable composition layer after the insulating material is laminated, and the burying property of the curable composition layer to the wiring pattern and flatness can be highly and suitably balanced.

The support used in the invention generally has a charging voltage (absolute value) of 500 V or below, preferably 200 V or below and more preferably 100 V or below so as to obtain the insulating material of the invention. Generally, since the resin film has an insulating property, it is likely to be electrically charged due to friction, and so forth. Therefore, it is preferred to eliminate charge on the surface of the support due to static electricity before the solution (or the dispersion) of the curable resin composition is applied to the support. When humidification is applied to the coating atmosphere to a suitable level, charging can be preferably prevented. A suitable humidity is 40 to 90%.

The support having low chargeability is not particularly limited by its production method. Suitable production methods of the support include (1) a molding method by use of a thermoplastic resin blended with an electrically conductive filler or a surfactant, (2) a method that irradiates soft X-rays to the resin film, (3) a method that brings the resin film into contact with an alcohol or a surfactant, (4) a method that molds an electrically conductive polymer and obtains a film, (5) a method that disposes an electrically conductive layer such as a thin film (thickness: about 50 to about 1,000 Å) of an electrically conductive metal such as copper or nickel to the whole or a part of the surface of the resin film on the surface side on which the curable resin layer is laminated, (6) a method that eliminates charge by conducting corona processing of the surface of the resin film before the solution (or the dispersion) of the curable composition is applied to the surface of the resin film, (7) a method that arranges a metallic earth in the proximity of the support film surface and eliminates the charge, and (8) a method that uses an electrically conductive roll as a feed roll of the support, and grounds the roll to eliminate the charge.

The conductive filler used in the method (1) described above is a powdery or fibrous metal or metal oxide, carbon black and graphite. The particle size of the conductive filler is not particularly limited, but is generally 0.01 to 50 μm, preferably 0.02 to 40 μm and more preferably 0.05 to 35 μm. When the particle size of the conductive filler is excessively small, the conductor filler cannot be easily mixed and dispersed into the resin. When the particle size is excessively great, on the contrary, the surface coarseness of the support becomes undesirably great. The amount of the conductive filler is not particularly limited, but is generally 0.1 to 20 parts by weight on the basis of 100 parts by weight of the resin constituting the support, preferably 0.3 to 15 parts by weight and more preferably 0.5 to 10 parts by weight. When the amount of the conductive filler is excessively small, the effect of imparting conductivity cannot be obtained, and when it is excessively great, the filler cannot be easily mixed and dispersed into the resin. Production of the support prepared by blending the conductive filler with the resin may be carried out in a customary manner, and can be done by, for example, a melt extrusion method and a solvent casting method. When the support blended with the conductive filler is used in the invention, admixture of foreign matter during the production of the insulating material and during lamination of the insulating material on the internal layer board can be avoided. Moreover, the occurrence of static electricity due to friction can be suppressed when the support is peeled, and attraction of foreign matter by this static electricity can be eliminated.

The soft X rays used in the method (2) generally have a wavelength of 50 to 0.2 nm, preferably 30 to 0.5 nm and more preferably 15 to 0.8 nm. Generally, electron beams accelerated to about 5 to about 100 keV are allowed to impinge against a metal, and X rays of a longer wavelength among the X rays generated thereby are used as the soft X rays.

The method of irradiating the soft X rays to the film surface is not particularly limited, and typical examples are the methods described in Japanese Unexamined Patent Publication (Kokai) Nos. 2000-21726 and 10-106789. The soft X rays are preferably irradiated to the support immediately before the layer of the curable resin composition is laminated because the charge removing effect can be exhibited to maximum. To prevent adhesion of foreign matter to the insulating material, it is effective in the invention to irradiate the soft X rays after the curable resin composition layer is laminated on the support.

The irradiation time of the soft X rays is not particularly limited so long as the charging voltage of the support falls within the range described above. When the soft X rays are irradiated to the insulating material, the irradiation time may be such that the charging voltage of the insulating material falls within the range described above. When the irradiation time is too long, a part of the curable resin composition is cured in some cases. Therefore, the irradiation is preferably stopped at the timing at which the curable resin composition is not yet cured.

Examples of the surfactant used in the method (3) are alkali metal salts of aliphatic acid, higher alcohol sulfuric acid esters and aliphatic acid amide suflonic acid, ternary ammonium salts, polyoxyethylene alkyl ethers and sorbitan alkyl esters. When blended with the resin, the surfactant can lower the charging voltage of the support besides the method that brings it into contact with the resin film surface.

The alcohol to be brought into contact with the support surface is not particularly limited. Examples of the alcohol include aliphatic alcohols such as methyl alcohol, ethyl alcohol, n-propyl alcohol, i-propyl alcohol, n-butyl alcohol, s-butyl alcohol and t-butyl alcohol, and alicyclic alcohols such as cyclopentanol and cyclohexanol. Most preferred among them is i-propyl alcohol from the aspect of wettability of the support and the charge removing effect.

The support can be brought into contact with the alcohol or with the surfactant by a method that immerses the support into an alcohol tank or a surfactant tank, a method that uses a roller impregnated with the alcohol or the surfactant and applies the alcohol or surfactant, and a method that sprays the alcohol or the surfactant. Contact with the alcohol or the surfactant is preferably carried out immediately before the layer of the curable resin composition is laminated on the support because a large charge removing effect can be obtained. The alcohol or the surfactant on the support may preferably be dried by blowing hot or cool air or vacuum drying before the curable resin composition is laminated.

When the contact operation of the alcohol or the surfactant is combined with the irradiation operation of the soft X rays described above, an insulating material having a small amount of foreign matter can be obtained more easily.

The foreign matter on the support surface is removed by use of cleaning means such as an adhesive roll, washing with a solvent or water, or suction, and admixture of the foreign matters into the later-appearing electrically insulating layer can be further prevented.

The method of laminating the curable composition layer on the support includes the steps of applying a solution (or dispersion) of the curable composition to the support and forming the coating layer, and drying the coating layer.

The curable resin composition used in the invention contains a known polymer used for forming an electrically insulating layer of a multi-layer circuit board. Examples of the polymer include an epoxy resin, a phenol resin, an acrylic resin, a polyimide resin, a polyisocyanate resin, a polyester resin, a polyphenyl ether resin, an alicyclic olefin polymer, a bismaleimide triazine resin (BT resin), polyamideimide, polyarylate, aromatic polyester, polyether ether ketone, polyetherimide, polyether ketone, polyether nitrile, polyether sulfone, polyketone, polyphenylene ether and polysulfone.

It is preferred in the invention to use at least one kind of polymer selected from the alicyclic olefin polymers and the aromatic polyethers from the aspect of heat resistance and radio frequency characteristics.

The alicyclic olefin polymer is a polymer of an olefin having an alicyclic structure. The alicyclic structure includes a cycloalkane structure and a cycloalkene structure. The alicyclic structure includes a monocyclic structure and polycyclic structures (condensation polycyclic structure, cross-linking cyclic structure and polycyclic structure comprising their combination).

The alicyclic olefin polymer generally contains a repeating unit or units derived from an olefin having the alicyclic structure (hereinafter merely called in some cases "alicyclic olefin"). The number of carbon atoms constituting the alicyclic structure is not particular limited, but is generally 4 to 30, preferably 5 to 20 and more preferably 5 to 15. The alicyclic olefin polymer within such a range is superior in mechanical strength, heat resistance and moldability.

The proportion of the repeating unit derived from the alicyclic olefin in the alicyclic olefin polymer is suitably selected in accordance with the object of use, and is generally 30 to 100 wt %, preferably 50 to 100 wt % and more preferably 70 to 100 wt %.

The alicyclic olefin polymer preferably has polar groups. Examples of the polar groups include a hydroxyl group, a carboxyl group, an alkoxy group, an epoxy group, a glycidyl group, an oxycarbonyl group, a carbonyl group, an amino group, an azide group, an ester group and a carboxylic acid anhydride group. Preferred among them are the carboxylic acid anhydride group and the carboxyl group.

The alicyclic olefin polymer is generally obtained by subjecting the alicyclic olefin to addition polymerization or ring-opening polymerization and if necessary, hydrogenating unsaturated bonds, or by subjecting aromatic olefins to addition polymerization and hydrogenating the aromatic ring of the resulting polymer.

The alicyclic olefin polymer having the polar groups can be obtained by, for example, 1) introducing a compound having polar groups into the alicyclic olefin polymer through a denaturation reaction, 2) (co)polymerizing monomers having the polar groups as the (co)polymerization components, or 3) (co)polymerizing monomers having the polar groups such as an ester group as the (co)polymerization components and then hydrolyzing the ester group.

Concrete examples of the alicyclic olefin polymer include ring-opened polymers of norbornene type monomers and their hydrogenated polymers, addition polymers of the norbornene type monomers, addition polymers between the norbornene type monomers and vinyl compounds, monocyclic cycloalkene polymers, alicyclic conjugated diene polymers, vinyl type alicyclic hydrocarbon polymers and their hydrogenated polymers, and aromatic ring hydrogenated polymers of aromatic olefin polymers.

Preferred among them are the ring-opened polymer of the norbornene type monomer and a hydrogenated polymer thereof, the addition polymer of the norbornene type monomer, the addition polymer of the norbornene type monomer and the vinyl compound, and the aromatic ring hydrogenated polymer of the aromatic olefin polymer. Particularly preferred is the hydrogenated polymer of the ring-opened polymer of the norbornene type monomer. The alicyclic olefin polymers described above can be used either alone or in combination of two or more kinds.

Concrete examples of the alicyclic olefins are listed below:
norbornene type monomers such as:
bicyclo[2.2.1]-hepto-2-ene (customary name: norbornane),
5-methyl-bicyclo[2.2.1]-hepto-2-ene, 5,5-dimethyl-bicyclo [2.2.1]-hepto-2-ene, 5-ethyl-bicyclo[2.2.1]-hepto-2-ene,
5-butyl-bicyclo-[2.2.1]-hepto-2-ene, 5-hexyl-bicyclo[2.2.1]-hepto-2-ene,
5-octyl-bicyclo[2.2.1]-hepto-2-ene,
5-octadecyl-bicyclo[2.2.1]-hepto-2-ene, 5-ethylidene-bicyclo[2.2.1]-hepto-2-ene,
5-methylidene-bicyclo[2.2.1]-hepto-2-ene,
5-vinyl-bicyclo[2.2.1]-hepto-2-ene,
5-propenyl-bicyclo[2.2.1]-hepto-2-ene,
5-methoxycarbonyl-bicyclo[2.2.1]-hepto-2-ene,
5-cyano-bicyclo[2.2.1]-hepto-2-ene,
5-methyl-5-methoxycarbonyl-bicyclo[2.2.1]-hepto-2-ene,
5-ethoxycarbonyl-bicyclo[2.2.1]-hepto-2-ene,
bicyclo[2.2.1]-hepto-5-enyl-2-methylpropionate,
bicyclo[2.2.1]-hepto-5-enyl-2-methyloctanate,
bicyclo[2.2.1]-hepto-2-ene-5,6-dicarboxylic acid anhydride,
5-hydroxymethyl-bicyclo[2.2.1]-hepto-2-ene,
5,6-di(hydroxymethyl)-bicyclo[2.2.1]-hepto-2-ene, 5-hydroxyisopropyl-bicyclo[2.2.1]-hepto-2-ene,
5,6-dicarboxy-bicyclo[2.2.1]-hepto-2-ene,
bicyclo[2.2.1]-hepto-2-ene-5,6-dicarboxylic acid imide,
5-cyclopentyl-bicyclo[2.2.1]-hepto-2-ene,
5-cyclohexyl-bicyclo[2.2.1]-hepto-2-ene,
5-cyclohexenyl-bicyclo[2.2.1]-hepto-2-ene,
5-phenyl-bicyclo[2.2.1]-hepto-2-ene,
tricyclo[4.3.0.1$^{2,5}$]deca-3,7-diene (customary name: dicyclopentadiene)
tricyclo[4.3.0.1$^{2,5}$]deca-3-ene,
tricyclo[4.4.0.1$^{2,5}$]undeca-3,7-diene,
tricyclo[4.4.0.1$^{2,5}$]undeca-3,8-diene,
tricyclo[4.4.0.1$^{2,5}$]undeca-3-ene,
tetracyclo[7.4.0.1$^{10,13}$.0$^{2,7}$]-trideca-2,4,6-11-tetra-ene(alias: 1,4-methano-1,4,4a,9a-tetrahydrofluorene),
tetracyclo[8.4.0.1$^{11,14}$.0$^{3,8}$]-tetradeca-3,5,7,12-tetra-ene (alias: 1,4-methano-1,4,4a,5,10,10a-hexahydroanthracene),
tetracyclo[4.4.0.1$^{2,5}$.1$^{7,10}$]-dodeca-3-ene (customary name: tetracyclododecene),
8-methyl-tetracyclo[4.4.0.1$^{2,5}$.1$^{7,10}$]-dodeca-3-ene,
8-ethyl-tetracyclo[4.4.0.1$^{2,5}$.1$^{7,10}$]-dodeca-3-ene,
8-methylidene-tetracyclo[4.4.0.1$^{2,5}$.1$^{7,10}$]-dodeca-3-ene,
8-ethylidene-tetracyclo[4.4.0.1$^{2,5}$.1$^{7,10}$]-dodeca-3-ene,
8-vinyl-tetracyclo[4.4.0.1$^{2,5}$.1$^{7,10}$]-dodeca-3-ene,
8-propenyl-tetracyclo[4.4.0.1$^{2,5}$.1$^{7,10}$]-dodeca-3-ene,
8-methoxycarbonyl-tetracyclo[4.4.0.1$^{2,5}$.1$^{7,10}$]-dodeca-3-ene,
8-methyl-8-methoxycarbonyl-tetracyclo[4.4.0.1$^{2,5}$.1$^{7,10}$]-dodeca-3-ene,
8-hydroxymethyl-tetracyclo[4.4.0.1$^{2,5}$.1$^{7,10}$]-dodeca-3ene,
8-carboxy-tetracyclo[4.4.0.1$^{2,5}$.1$^{7,10}$]-dodeca-3-ene,
8-cyclopentyl-tetracyclo[4.4.0.1$^{2,5}$.1$^{7,10}$]-dodeca-3-ene,
8-cyclohexenyl-tetracyclo[4.4.0.1$^{2,5}$.1$^{7,10}$]-dodeca-3ene,
8-cyclohexenyl-tetracyclo[4.4.0.1$^{2,5}$.1$^{7,10}$]-dodeca-3-ene,
8-phenyl-tetracyclo[4.4.0.1$^{2,5}$.1$^{7,10}$]-dodeca-3-ene,
pentacyclo[6.5.1.1$^{3,6}$0$^{2,7}$.0$^{9,13}$]-pentadeca-3,10-diene,
pentacyclo[7.4.0.1$^{3,6}$1$^{10,13}$.0$^{2,7}$]-pentadeca-4,11-diene,
tetracyclo[6.5.0.1$^{2,5}$.0$^{8,13}$]trideca-3,8,10,12-tetraene, and
tetracyclo[6.6.0.1$^{2,5}$.1$^{8,13}$]tetradeca-3,8,10,12-tetraene;
monocyclic cycloalkene such as cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene and cycloheptene;
vinyl alicyclic hydrocarbon monomers such as vinylcyclohexene and vinylcyclohexane; and
alicyclic conjugated diene monomers such as cyclopentadiene and cyclohexadiene.

Examples of the aromatic olefin are styrene, α-methylstyrene and divinylbenzene. The alicyclic olefin and/or aromatic olefin may be used either alone or in combination of two or more kinds.

The alicyclic olefin polymer may be prepared by copolymerizing the alicyclic olefin and/or the aromatic olefin with a monomer copolymerizable with these olefins.

Examples of the monomers copolymerizable with the alicyclic olefin or the aromatic olefin are olefins or α-olefins of 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosene; non-conjugated dienes such as 1,4-hexadiene, 4-methyl-1,4-hexadiene, 5-methyl-1,4-hexadiene and 1,7-octadiene; and conjugated dienes such as 1,3-butadiene and isoprene. These monomers can be used either alone or in combination with two or more kinds. When these monomers are subjected to ring-opening copolymerization, they may function as a molecular weight regulating agent.

The polymerization method of the alicyclic olefin or/and the aromatic olefin and the hydrogenation method that is carried out, whenever necessary, are not particularly limited, and they can be conducted by using a known method.

The alicyclic olefin polymer is not particularly limited by its molecular weight. The molecular weight of the alicyclic olefin polymer is generally 1,000 to 1,000,000, preferably 5,000 to 500,000 and more preferably 10,000 to 250,000 in terms of a weight average molecular weight (Mw) calculated as polystyrene measured by gel permeation chromatography (GPC) using cyclohexane or toluene as a solvent. When the weight average molecular weight of the alicyclic olefin polymer is within this range, heat resistance, flatness of the surface of a molding, and so forth, are balanced satisfactorily and suitably.

The molecular weight distribution of the alicyclic olefin polymer is ordinarily 10 or less, preferably 7 or less and more preferably 5 or less in terms of a ratio (Mw/Mn) of the weight average molecular weight (Mw) measured by GPC using cyclohexane or toluene as the solvent to the number average molecular weight (Mn).

The weight average molecular weight (Mw), the range of the molecular weight distribution (Mw/Mn) and the measurement method can be suitably adapted to the norbornene-type polymers, but are not particularly restrictive. In the case of the alicyclic olefin polymers the weight average molecular weight and the molecular weight distribution of which cannot be measured by the method described above, it is possible to use the polymers having a melt viscosity and a degree of polymerization to such an extent that a resin layer can be formed by an ordinary melt processing method.

The glass transition temperature of the alicyclic olefin polymer may be suitably selected in accordance with the object of use, and is generally 50° C. or above, preferably 70° C. or above, more preferably 100° C. or above and most preferably 125° C. or above.

The aromatic polyether is a polyether having an aromatic ring, and can be generally obtained by causing a 2,6-disubstituted phenol such as 2,6-dimethyl phenol or 2,6-diphenyl phenol to react with oxygen in the presence of a basic copper (II) salt such as a copper (II) amine complex. Examples of the aromatic polyether polymers are polyphenylene ether and denatured polyphenylene ether. Among them, denatured polyphenylene ether having a small dielectric constant and a small dielectric tangent is suitably used. These alicyclic olefin polymer and aromatic polyether can be used either alone or in combination of two or more kinds.

The curable composition used in the invention further contains a curing agent, whenever desired. The curing agent may be an ionic curing agent, a radical reactive curing agent or a curing agent that is both ionic and radical. However, the ionic curing agent is preferred from the aspects of insulation resistance, heat resistance, chemical resistance and compatibility with the alicyclic olefin polymer.

Examples of the ionic curing agent include aliphatic polyamine compounds, aromatic polyamine compounds, bisazide compounds, acid anhdyrides, dicarboxylic acid compounds, diol compounds, triols, polyvalent phenols, polyamide compounds, diisocynate compound and polyvalent epoxy compounds that are solid at normal temperature. An example of the radical curing agent is organic peroxide. Among them, the diol compounds, the polyvalent phenol compounds and the polyvalent epoxy compounds that are solid at normal temperature are preferred. More preferred are the polyvalent epoxy compounds that are solid at normal temperature, particularly brominated polyvalent epoxy compounds that are solid at normal temperature.

These curing agents can be used either alone or in combination of two or more kinds, and their blend proportion is generally 5 to 150 parts by weight, preferably 15 to 110 parts by weight and more preferably 30 to 100 parts by weight, on the basis of 100 parts by weight of the polymer such as the alicyclic olefin polymer.

To accelerate the curing reaction between the alicyclic olefin polymer and the curing agent, the invention can also use a curing accelerator and a curing assistant. The curing accelerator is a tertiary amine compound or a trifluoroboron complex when the curing agent is polyvalent epoxy compound. The tertiary amine compound is particularly preferred because it can improve stacking property to fine wiring, insulating resistance, heat resistance and chemical resistance.

Concrete examples of the tertiary amine compound are linear tertiary amine compounds such as benzylmethylamine, triethanolamide, triethylamine, tributylamine, tribenzylamine and dimethylformamide, and nitrogen-containing hetero ring compounds such as pyrazols, pyridines, pyrazines, pyrimidines, indasols, quinolines, isoquinolines, imidazoles and triazoles. Among them, the imidazoles, particularly substituted imidazole compounds having substitution groups, are preferred.

Concrete examples of such a substituted imidazole compound include 2-thylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole; 2-phenylimidazole, 1-benzyl-2-methylimidazole, 1-benzyl-2-ethylimidazole, benzimidazole, 2-ethyl-4-methyl-1-(2'-cyanoethyl)imidazole, 2-ethyl-4-methyl-1-[2'-(3",5"-diaminotriazynyl)ethy]imidazole and 1-benzyl-2-phenylimidazole. Among them, the imidazole compounds substituted by a hydrocarbon group having a ring structure are preferred, and 1-benzyl-2-phenylimidazole is particularly preferred.

These curing accelerator are used either alone or in combination of two or more kinds. The blend amount of the curing accelerator is suitably determined in accordance with the object of use, but is generally 0.001 to 30 parts by weight, preferably 0.01 to 10 parts by weight and more preferably 0.03 to 5 parts by weight, on the basis of 100 parts by weight of the polymer.

The curing assistant is not particularly limited. Examples of the curing assistant include oxime-nitroso type curing assistants such as quinone dioxime, benzoquinone dioxime, and p-nitrosophenol; maleimide type curing assistants such as N,N-m-phenylene bismaleimide; allyl type curing assistants such as diallyl phthalate, triallyl cyanurate and triallyl isocyanurate; methacrylate type curing assistants such as ethyleneglycol dimethacrylate and trimethylolpropane trimethacrylate; and vinyl-type curing assistants such as vinylketone, ethylvinylbenzene and divinylbenzene.

These curing assistants can be used either alone or in combination of two or more kinds. The blend ratio is generally 1 to 1,000 parts by weight and preferably 10 to 500 parts by weight on the basis of 100 parts by weight of the curing agent.

To improve insulating resistance and peel resistance, a thiol compound is further blended preferably as a blending agent. A polyvalent thiol compound having at least two thiol groups in the molecules thereof is preferred, and a thiol compound having a hetero-ring structure in the molecules thereof is more preferred. A triazine ring structure is preferred as the hetero-ring structure. When the burying of wiring is taken into consideration, a triazine thiol compound is particularly preferred. The blend amount of the thiol compound is generally 0.001 to 30 parts by weight and preferably 0.01 to 10 parts by weight on the basis of 100 parts by weight of the polymer. When the blend amount is too small, the effect of improving insulating resistance and peel resistance cannot be obtained easily. On the other hand, when the blend amount is too great, the drops in heat resistance and in chemical resistance becomes remarkable.

The curable composition described above is dissolved or dispersed in an organic solvent. It is preferred in the invention to use the curable composition in the solution form because the amount of foreign matter is small and a uniform electrically insulating layer can be formed. Examples of the organic solvent used include aromatic hydrocarbon solvents such as toluene, xylene, ethylbenzene and trimethylbenzene; aliphatic hydrocarbon solvents such as n-pentane, n-hexane and n-heptane, alicyclic hydrocarbon solvents such as cyclopentane and cyclohexane, halogenated hydrocarbon solvents such as chlorobenzene, dichlorobenzene and trichlorobenzene, and ketone type solvents such as methyl ethyl ketone, methyl isobutyl ketone, cyclopentanone and cyclohexanone. These solvents can be used either alone or in combination of two or more kinds. Among them, a mixed solvent of a non-polar solvents such as the aromatic hydrocarbon solvent or the alicyclic hydrocarbon solvent and a polar solvent such as the ketone type solvent is preferably used because it exhibits excellent burying of fine wiring but does not generate air bubbles. The amount of use of the solvent is suitably selected in accordance with the object of use, but is such that the solid content concentration in the solution or dispersion of the curable composition is generally 5 to 70 wt %, preferably 10 to 65 wt % and more preferably 20 to 60 wt %. The method of dissolving (or dispersing) the curable composition in the solvent is, for example, a mixing method that uses a mixer and a magnetic stirrer, a high-speed homogenizer, dispersion, a planetary mixer, a biaxial mixer, a ball mill or a three-roll mixer. It is preferred to remove as much as possible of the foreign matter by filtrating the solution (or dispersion) of the curable composition so prepared, with a micro-filter.

Coating methods of the solution (or dispersion) of the curable composition to the support surface are not particularly limited, and known methods such as dip coating, roll coating, curtain coating, die coating, slit coating, bar coating and knife coating can be employed.

The coating amount of the solution (dispersion) of the curable composition is such that the thickness of the curable composition layer obtained by drying and curing the solution (dispersion) of the curable composition becomes generally 10 to 200 μm and particularly 15 to 150 μm. When the thickness is too small, ion migration resistance drops and the shape of the internal layer circuit appears as such to the surface. When the thickness is too great, the multi-layer circuit board becomes thick as a whole and miniaturization cannot be accomplished.

When the solution (or dispersion) of the curable composition is continuously applied by use of a coater, the peripheral portion of the support (resin film) fed into the coater locally enters a vacuum state. Therefore, micro-particles (foreign matter) in the air are sucked into the coater and adhere to the resin film surface before coating, or mix into the solution (dispersion) of the curable composition, or adhere to coating surface. To prevent admixture of the foreign matter, it is therefore preferred to keep the environment, in which the resin film is fed into the coater, under a positive pressure state.

The support (coated support) coated with the solution of the curable resin composition is conveyed to a drying portion.

In the invention, the time after the coating step to the start of a drying step (pre-drying) is set to 10 to 120 second, preferably 20 to 90 seconds. If this time is shortened, drying is started before the coated surface, after coating, settles to a flat surface, and non-uniformity of the solution and of the coating is likely to occur. If the pre-drying time is too long, on the other hand, the total time till the finish of drying is long. The pre-drying temperature is preferably 0 to 40° C. When this temperature is low, the moisture in air dews on the surface of the non-dried coating film and film quality of the coating film is likely to be deteriorated. If the temperature is too high, drastic evaporation of the solvent creates bubbles in the coating film and a film having high quality and high flatness cannot be obtained, in some cases.

The drying condition in the drying step is suitably determined in accordance with the kind of the solvent used. The drying temperature is generally 20 to 300° C. and preferably 30 to 200° C., and the drying time is generally 30 seconds to 1 hour and preferably 1 minute to 30 minutes.

It is the feature of the invention that a suitable method of the invention divides the drying portion into at least a first drying zone and a second drying zone, the drying time in each drying zone is 40 to 150 seconds, and the drying temperature in the second drying zone is higher than the drying temperature in the first drying zone. The drying temperature in the first drying zone is 20 to 90° C. and preferably 20 to 60° C. When the drying temperature in the first drying zone is less than 20° C., the drying time of the solvent gets elongated. On the other hand, when the temperature in the first drying zone is higher than 90° C., bubbles develop in the coating film and a film having high quality and high flatness cannot be obtained easily. The temperature in the second drying zone is 70 to 150° C. and preferably 70 to 120° C. When the drying temperature is less than 70° C. in the second drying zone, the total drying time gets elongated. On the other hand, when the drying temperature exceeds 150° C., bubbles develop in the coating film and a film having a high quality and a high flatness cannot be obtained easily. Drying is generally carried out by blowing air (drying air) heated to a predetermined temperature to the surface of the coating film. The velocity of the drying air can be suitably set but is generally 1 m/sec to 100 m/sec and preferably 5 m/sec to 60 m/sec. Drying air is preferably blown substantially vertically to the surface of the coating film and/or the surface of the support.

A preferred embodiment of the invention divides the drying zone into three drying zones, that is, a first drying zone in which drying is conducted at 20 to 90° C., a third drying zone in which drying is conducted at 70 to 130° C. and a fourth drying zone in which drying is conducted at 120 to 150° C., the drying time in each drying zone is 40 to 150 seconds, the temperature of the third drying zone is higher than the temperature of the first drying zone, and the temperature of the fourth drying zone is higher than the temperature of the third drying zone. In other words, the second drying zone described above is further divided into the third drying zone and the fourth drying zone, and management of the drying temperature and the drying time is conducted more precisely. In this case, management of the drying temperature and the drying time can be conducted in a greater number of stages by dividing the drying zones having different temperatures into four or more stages.

A method of producing an insulating material comprising a support and a curable composition layer will be more concretely explained with reference to a continuous coating apparatus shown in FIG. 1. The production apparatus shown in FIG. 1 is an apparatus for continuously producing an insulating material (B stage film) useful as an electrically insulating layer of a circuit board. The apparatus is installed, as a whole, inside a clean room. The degree of cleanness of the clean room is generally 10,000 or below, preferably 1,000 or below, and particularly preferably 500 or below. This apparatus includes a feeding portion 1 of a support film (support) 2, a coating portion 3 for applying a curable resin composition to the support film 2 in a belt-like continuous form fed from the feed portion 1, a conveying portion 7 for conveying the support film 4 coated with the curable resin composition into a drying portion 8, the drying portion 8 divided to three zones of a drying zone A, a drying zone B and a drying zone C, and a film taking-up portion 9 for taking up the support film, from which a solvent of the coating layer is removed and which is dried, into a roll.

The support film 2 is continuously fed from the film feeding portion 1 into the coating portion 3. The feeding speed (moving speed) of the support film 2 can be freely set, but is generally 0.5 to 30 m/min. In the coating portion 3, a predetermined amount of the solution of the curable resin composition is continuously fed from a tank 6 to a coating head portion, not shown, through a piping arrangement 5, and is applied in a predetermined coating amount to the support film 2.

The solution (dispersion) of the curable composition is coated to the surface of the resin film 2 fed into the coating portion 3. A known coating apparatus, not shown, such as a die coater, a curtain coater, a bar coater, a knife coater or a roll coater is installed in the coating portion 3. The solution of the curable composition is stored in the tank 6 and is supplied to a head portion, not shown, of the coating apparatus through the piping arrangement 5. In this case, it is preferred not to expose the solution to atmospheric air lest foreign matter mixes in the solution supplied. To remove foreign matter in the solution of the curable composition, it is also preferred to pass the composition solution through a filter immediately before it is supplied to the head portion.

The head portion of the coating apparatus always keeps a predetermined gap with the resin film surface. When a predetermined amount of the solution of the curable composition is extruded from the head portion, a film of the curable composition is formed in a constant coating amount on the resin film surface.

In this case, if the piping arrangement 5 for supplying the curable composition inside the tank to the head portion of the coating apparatus is made of a resin, the solution of the curable composition is likely to be electrically charged due to the friction of the solution of the curable composition flowing inside the piping arrangement 5. When the solution is electrically charged, the solution is likely to adsorb foreign matter in a micro-particulate form. In such a case, the piping arrangement is preferably made of a non-chargeable metal.

When the piping arrangement 5 is disposed in a curved arrangement or when a large number of joints such as valves and elbows exist, convection is likely to develop inside the solution of the curable composition flowing in the piping arrangement 5. When this convection occurs, the solution is likely to be electrically charged, and the curable composition is likely to be partially solidified inside this convection. Therefore, the piping arrangement 5 is preferably arranged linearly with the minimum number of joints.

During coating, too, the resin film is likely to be electrically charged due to friction between the resin film and the solution. To prevent adsorption of foreign matter due to the charge, it is preferred to dispose another member to be charged in the proximity of the coating surface of the resin sheet so that it can preferentially adsorb foreign matter and can prevent adsorption to the resin sheet.

In the conveying portion 7, the support film (coated article) 4 coated with the solution of the curable resin composition is conveyed to the drying portion 8 at a predetermined speed. The conveying time from the coating process to the drying portion can be freely set, and is preferably 10 to 120 second, particularly 20 to 90 seconds, though the conveying time depends on the conveying distance. The conveying temperature is preferably set to 0 to 40° C. To prevent the surface of the coating film from being cooled by the heat of evaporation of the solvent and to prevent the moisture in air from dewing on the surface of the coating film, it is preferred in this case to arrange heating means, not shown, on both sides (or above and below) the moving position of the coated support film between the coating portion and the drying portion. When a cover that covers the conveying portion as a whole is disposed, admixture of foreign matter to the non-dried coating layer can be prevented.

In the apparatus shown in FIG. 1, the drying portion 8 is divided into three drying zones, that is, a drying zone A, a drying zone B and a drying zone C. The coating article flows from the upper left to the upper right in the drawing at a predetermined speed. The drying portion 8 can program the drying process in the following way. Namely, in each drying zone, drying air regulated to a predetermined temperature is blown. These three drying zones are allocated to the first and second drying zones, or the first, third and fourth zones described above, and the temperatures of the first and second drying zones or the first, third and fourth drying zones are adjusted to the ranges described above. The retention time of the coated support film in each drying zone depends on the thickness of the coating film and the kind of the solution (drying solvent) of the curable composition, but in the invention, it is set to 40 to 150 second and preferably 50 to 130 second. Setting of the retention time can be made by regulating the temperature of drying air and the moving speed and moving distance of the coated support film (by changing the gap of each drying zone).

When drying air contains foreign matter, foreign matter is likely to be adsorbed to the surface of the film. Therefore, drying air to be supplied must be passed through an air filter to remove foreign matter and must be converted to clean air. The greater the feed amount of drying air, the higher becomes the possibility of admixture of foreign matter. Therefore, the feed amount of drying air is preferably as small as possible.

The support film with the semi-dried film that leaves the drying zone C is taken up into a roll by the film taking-up portion 9. Incidentally, it is preferred to remove the foreign matters adhering to the surface of the curable composition layer by use of an adhesive roll before take-up. When the insulating material is taken up, the curable composition layer and the back of the resin film come into mutual contact, so that the foreign matters on the back of the resin film, if any, are likely to adhere to the surface of the curable composition layer. It is therefore preferred to take up the film while the surface of the curable composition layer is covered or laminated with a protective film. A core used for taking up is preferably made of a plastic or a metal to prevent admixture of the foreign matters.

After being taken up into the roll shape, the resin film with the curable composition layer is thereafter packaged and conveyed. In this case, too, a clean transportation container is preferably used lest the foreign matter from the packaging materials adheres to the resin film.

In the manner described above, it becomes possible to form a semi-cured film (insulating material) of the curable resin composition that is free from bubbles in the film and excellent in flatness on the support film (support).

The resin film with the curable composition layer is sometimes cut in accordance with the size of the multi-layer circuit board. Therefore, caution must be paid lest micro-particles of dust and dirt occurring during cutting adhere to the surface of the curable composition layer. To this end, cutting is preferably carried out after the insulating material is heated to a temperature at which it becomes flexible, or generally 30 to 60° C.

As described above, admixture of the foreign matters of the curable composition layer can be minimized as a whole. Incidentally, the production of the curable composition layer by using the coating apparatus described above merely represents an embodiment of the invention. Therefore, the insulating material that minimizes admixture of foreign matter to the curable composition layer can be produced by applying similar improvement to other known coating apparatuses, or by applying various improvements for preventing admixture of the foreign matter to each production step.

The insulating material according to the invention is laminated with an internal layer board and can be suitably used for producing a multi-layer circuit board. The internal layer board has a conductor circuit (1) formed on an electrically insulating layer (1). The electrically insulating layer (1) is formed by curing a curable resin composition containing a known electrically conductive material (such as an alicyclic olefin polymer, an epoxy resin, a maleimide resin, a (meth) acrylic resin, a diallyl phthalate resin, a triazine resin, a polyphenylether and glass). It may also incorporate a reinforcing material such as a glass cloth or an aramide non-woven fabric.

The conductor circuit (1) is an electric circuit formed of a conductor such as an electrically conductive metal, and its circuit construction is the same as the circuit construction used in ordinary multi-layer circuit boards.

Surface coarseness of the electrically insulating layer (1) of the internal layer board is preferably adjusted. The surface coarseness Ra of the insulating layer is generally 0.1 to 400 nm, preferably 0.2 to 80 nm and particularly preferably 0.4 to 50 nm. When Ra is within this range, mutual adhesion is high between the electrically insulating layers, and noise does not easily enter a high frequency signal flowing through a circuit.

Concrete examples of the internal layer board are a printed wiring board and a silicon wafer board. The thickness of the internal layer board is generally from 50 μm to 10 mm and preferably from 60 μm to 5 mm.

Lamination is made so that the curable composition layer comes into contact with the surface of the internal layer board, and heat bonding is made by use of a pressing device such as a press laminator, a press, a vacuum laminator, a vacuum press or a roll laminator. In this case, lamination must be conducted in a clean atmosphere lest foreign matter adheres to the superposition surface.

To conduct lamination to the internal layer board, heat curing can be conducted after the support is peeled, but lamination to the internal layer board can also be made continuously by use of a heat roll.

Heat bonding is preferably carried out in vacuum to improve the burying of wiring and to suppress the occurrence of bubbles. The heat bonding temperature is generally 30 to 250° C. and preferably 70 to 200° C. The bonding pressure is generally 0.1 to 200 kgf/cm$^2$ and preferably 1 to 100 kgf/cm$^2$. The bonding time is generally 30 seconds to 5 hours and preferably 1 minute to 3 hours. The pressure is generally reduced to 760 mmHg to 0.01 mmHg and preferably 300 mmHg to 0.1 mmHg.

After bonding is completed, the curable composition layer is cured to form the electrically insulating layer. The curing temperature for curing the curable composition varies depending on the kind of the curing agent, etc, but is generally 30 to 400° C., preferably 70 to 300° C. and more preferably 100 to 200° C. The curing time is generally 0.1 to 5 hours and preferably 0.5 to 3 hours.

When the resulting laminate has a support, the support is wholly removed, and a new conductor circuit (2) is formed on the electrically insulating layer (2). When the support is formed of the conductor material (such as a metal foil), the conductive material is left either partially or wholly and can be as such used for the conductor circuit (2).

The conductor circuit of the lower layer and the conductor layer of the upper layer separated from each other by the electrically insulating layer are electrically connected to each other through a via-contact (through-contact). The via-contact (through-contact) can be formed by physical treatment such as drilling or laser to form a via-hole (through-hole), and embedding an electrically conductive material into the via-hole. Among these hole formation methods, laser processing using a $CO_2$ laser, an excimer laser or a UV-YAG laser is preferred because it can form the via-hole having a smaller size without affecting the properties of the electrically insulating layer. The insulating material according to the invention has the curable composition layer in which the content of the foreign matters having particle sizes of 50 µm or below is reduced. Therefore, a precise via-hole or through-hole having a pore diameter of 50 µm or below can be formed, and the electrically conductive material can be completely embedded in the hole.

Methods of forming the conductor circuit (2) include a wet plating method such as electroless plating and a dry plating method such as sputtering and vacuum deposition. To improve adhesion between the electrically insulating layer and the conductor circuit (2), it is preferred to bring, in advance, the surface of the electrically insulating layer into contact with a solution of a permanganate or chromate, or to apply plasma processing.

Electrically insulating layers and conductor circuits can be laminated in many layers by using the resulting support having the conductor circuit (2) formed thereon as a new internal layer board.

In electronic appliances such as computers and mobile telephones, the multi-layer circuit board obtained in this way can be used as a printed wiring board to which semiconductor devices such as a CPU and a memory, and other components, are packaged.

Next, the invention will be hereinafter explained in further detail with reference to Examples and Comparative Examines. Incidentally, the term "part or parts" used in Examples and Comparative Examples represents "part or parts by weight" unless otherwise specified.

PRODUCTION EXAMPLE 1

Ethyltetracyclododencene was subjected to ring-opening polymerization, and a hydrogenation reaction was carried out so that a hydrogenation ratio became 99% or more. There was thus obtained a ring-opened polymer hydrogenated product having a number average molecular weight (Mn) of 32,200, a weight average molecular weight (Mw) of 55,800 and a glass transition temperature (Tg) of 140° C.

Next, 28 parts of this ring-opened polymer hydrogenated product, 10 parts of maleic anhydride and 3 parts of dicumylperoxide were dissolved in 130 parts of t-butylbenzene, and were allowed to react at 140° C. for 6 hours. The solution of the reaction product so obtained was poured into large amounts of methanol and the reaction product was solidified. The solidified product was vacuum dried at 100° C. for 20 hours to give a maleic acid denatured hydrogenated product. The polymer hydrogenated product had Mn=33,200, Mw=68,300 and Tg=170° C. The maleic acid group content of the polymer hydrogenated product was about 25 mol %.

Next, 100 parts of the resulting maleic acid denatured ring-opened polymer hydrogenated product, 50 parts of brominated bisphenol-A type epoxy resin ("Araldite AER8049", trade name, product of Asahi-Chiba Co.), 0.1 part of 1-benzyl-2-phenylimidasol, 10 parts of antimony pentaoxide and 5 parts of a silicon resin ("Tospearl", trademark, product of Toshiba Silicon Co.) were dissolved in a mixed solvent consisting of 135 parts of xylene and 90 parts of cyclopentanone to give a solution of a curable composition.

COMPARATIVE EXAMPLE

The resulting solution of the curable composition was filtered through a "Teflon" (trademark) micro-filter having a pore diameter of 3 microns, was then applied to a polyethylene terephthalate film having a size of 350 mm square and a thickness of 50µ by using a bar coater, and was heated and dried at 50° C. for 70 second, at 90° C. for 70 seconds and at 120° C. for 70 seconds to give a 50 µm-thick film.

Example 1

The coating apparatus shown in FIG. 1 was installed inside a clean room of Class 100 (0.5 µm) or below. After the solution of the curable composition was filtrated through a Teflon precision filter of a pore diameter of 3 microns, the filtrate was applied to a polyethylene naphthalate film having a width of 350 mm and a thickness of 50µ ("Teonex Film", trademark, product of Teijin-DuPont Co.) by use of a die coater, and was heated and dried inside a drying oven at 50° C. for 70 sec, in a drying oven at 90° C. for 70 sec and in a drying oven at 120° C. for 70 sec to give an elongated roll film having a thickness of 50 µm and a length of 100 m.

Example 2

A 50 µm-thick insulating film was obtained in the same way as in Example 1 with the exception that a foreign matter removing device using an adhesive roll was fitted between the take-out portion of the support film and the coating head to remove foreign matter on the surface of the resin film (support).

Example 3

A 50 µm-thick insulating film was obtained in the same way as in Example 1 with the exception that a corona processing device for removing charge of the surface of the resin film was installed between the take-out portion of the support film and the coating head to remove the charge on the surface of the resin film, the charge quantity of the support film was controlled to 0.5 kV or below during coating, and the humidity inside the clean room was controlled to 60%.

Example 4

A 50 µm-thick insulating film was obtained in the same way as in Example 1 with the exception that the coating device was kept at a positive pressure in example 3, piping arrangement for sending the solution of the curable composition to the coating head portion was changed to a metal piping arrangement arranged as linearly as possible, drying air was passed through a filter and the take-up core was made of a resin.

(Measurement of Particle Size and Amount of foreign Matter Mixed in Curable Composition Layer)

Figure 2:
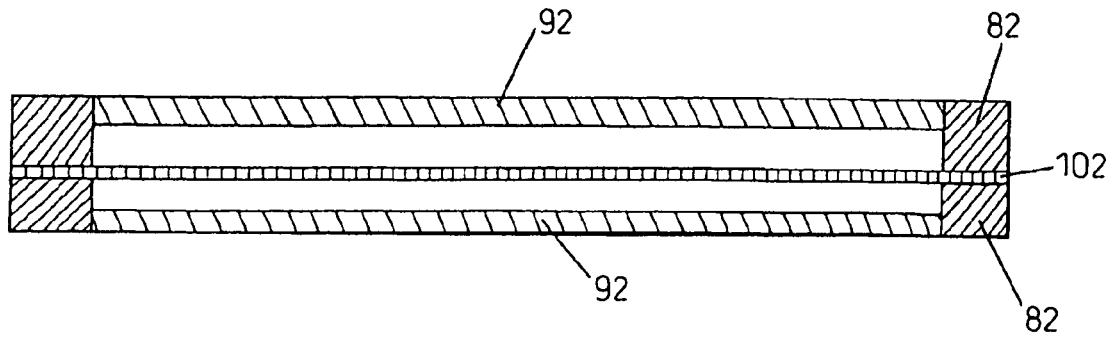
FIG. 2 is a sectional view of a sample for observing foreign matters existing inside or on a surface of a curable composition of the insulating material of the invention through an optical microscope.

The central portion of the elongated belt-like insulating material was cut inside the clean room. Next, the support was peeled and a film of the curable resin composition layer was obtained. The film 102 was then sandwiched between resin frames 82 as shown in FIG. 2. While a space of about 3 mm was secured between upper and lower slide glass 92, the film 102 was fixed in such a fashion that focusing was done only on the curable resin composition layer and was used as a measurement sample. The measurement sample was scanned and inspected through an optical microscope capable of confirming moving distances in X, Y and Z directions, and the amount of foreign matter was measured on a monitor screen (200×) and on a photo (125×) outputted by a video printer. Measurement was made under the condition where the depth of the subject was greater than the thickness of the curable resin composition layer. Since this measurement method could measure only the foreign matters contained in the curable resin composition layer, the measurement error was small and confirmation of the foreign matter could be easily made. While the sample was moved by 1.0 mm in the Y-axis direction with an area of moving distance 1.0 mm×0.5 mm, measurement was made for 200 zones in total (total measurement area: 1.0 cm$^2$). The amount of foreign matter was measured in accordance with the particle size with a scale separately produced on the monitor screen as the reference.

Table 1 tabulates the measurement result. The row in Table 1 represents the particle sizes of the foreign matter and the numeral in the Table represents the amount of foreign matter counted through observation.

(Insulating Resistance Test)

A comb-shaped electrode having a wiring gap of 50 microns and a wiring width of 50 microns was formed on the internal layer board, and the insulating material obtained in each of Examples and Comparative Example described above was superposed in such a fashion that the curable composition layer came into contact with the electrode. The insulating material was bonded at 150° C. and a bonding pressure of 5 kgf/cm$^2$ for 10 minutes under a vacuum of 1 mmHg by use of a vacuum laminator. Next, the curable composition layer was cured to form the electrically insulating layer (2), and the support film was peeled to give the multi-layer circuit board.

Next, each of the resulting multi-layer circuit boards was left standing at a DC voltage of 50 V under a 120° C. saturated water vapor condition, and 300 hours later the electric resistance value between the comb-shaped electrodes was measured. Symbol ⊚ represents the electric resistance of 10$^9$ Ω or more, ○ represents the resistance of 10$^8$ to less than 10$^9$ Ω, Δ represents the resistance less than 10$^8$ Ω without short-circuit, and X represents samples having short-circuit. The result is tabulated in Table 1.

(Evaluation Test of Burying Property)

Each of the resulting multi-layer circuit boards was cut, and the cut surface was observed for 100 wirings through a scanning electron microscope. Symbol ⊚ represents the case where no wire having voids existed in 100 wirings, ○ represents the case where 1 to 3 wirings had a void, Δ represents the case where 4 to 6 wirings had a void and X represents the case where 7 or more wirings had a void. The Table 1 tabulates the result.

(Measurement of Occurrence Quantity of Cracks)

The electrically insulating layer (2) of each of the resulting multi-layer circuit boards was observed by eye from the upper surface. Symbol ○ represents the case where crack did not at all exist per cm$^2$, Δ represents the case where 1 to 5 cracks existed and X represents the case where 6 or more cracks existed. Table 1 tabulates the result.

TABLE 1

| | number of foreign matters (pieces) | | | | insulating property hours | burying property | crack occurrence |
|---|---|---|---|---|---|---|---|
| | −10 μm | 10 – 30 μm | 30 – 50 μm | 50 μm – | | | |
| Example 1 | 2369 | 197 | 28 | 0 | Δ | Δ | Δ |
| Example 2 | 2262 | 68 | 4 | 0 | ○ | Δ | ○ |
| Example 3 | 1841 | 46 | 0 | 0 | ⊚ | ○ | ○ |
| Example 4 | 380 | 9 | 0 | 0 | ⊚ | ⊚ | ○ |
| Comparative Example | 2037 | 305 | 65 | 41 | Δ | x | x |

It could be clearly seen from Table 1 that the amount of foreign matter having a particle size within the range of 30 to 50 μm in the electrically insulating layer was remarkably decreased in comparison with that of Comparative Example. This also held true of foreign matter having particle sizes of 30 μm or below.

The occurrence amount of cracks was by far smaller in the multi-layer circuit boards of Examples than in that of Comparative Example, and the multi-layer circuit boards of Examples had excellent insulating resistance after a high-temperature high-humidity test for 300 hours, and also excellent burying property.

PRODUCTION EXAMPLE 2

8-ethyltetracyclo[4.4.1$^{2,5}$1$^{7,10}$.0]-3-dodecene was subjected to ring-opening polymerization by a known method by using a polymerization catalyst consisting of tungsten hexachloride, triisobutylaluminum and isobutyl alcohol, and then to a hydrogenation reaction by using a hydrogenation catalyst consisting of nickel acetylacetonate and triisobutylaluminum to give a norbornene type ring-opened polymer hydrogenated product (hereinafter called "polymer A"). The polymer A had a hydrogenation ratio of 99% or more.

Next, 100 parts of the polymer A, 35 parts of maleic anhydride, 3.5 parts of dicumyl peroxide and 300 parts of t-butylbenzene were mixed and were reacted in an autoclave at 135° C. for 4 hours. The reaction solution was added drop-wise to isopropanol, and was then solidified and dried to give a denatured polymer. The maleic anhydride denatured ring-opened polymer hydrogenated product so obtained had Tg of 158° C., a weight average molecular weight (Mw) of 55,400 and a denaturation ratio (maleic acid group content) of 26 mol %.

Next, 100 parts of maleic anhydride denaturated polymer hydrogenarated product, 50 parts of brominated bisphenol-A ("Araldite AER8049", trademark, product of Asahi-Chiba Co.), 0.1 part of 1-benzyl-2-phenylimidazol, 10 parts of antimony pentoxide and 5 parts of silicon resin ("Tospearl", trademark, product of Toshiba Silicon Co.) were mixed by using a planetary stirrer (3,000 rpm×10 min), and were dissolved in a trimethylbenzene/cyclohexanone (6/4 weight ratio) solution so that the amount of the mixture became 30 wt % to give a solution of the curable resin composition.

Examples 5 to 9

The solution of the curable resin composition obtained in Production Example 2 was continuously applied to a belt-like, continuous, 75 micron-thick polyethylene naphthalate film ("Teonex film", trademark, product of Teijin-DuPont Co.) to a thickness of a coating film after drying of 50 μm in the same way as in Example 4 by using the production apparatus shown in FIG. 1. The film was then conveyed and dried under the condition shown in Table 2. Incidentally, drying air in each drying zone inside the drying portion was blown at a velocity of 20 m/sec from the vertical direction of the coating film surface and the support surface. Pre-drying in Table 2 represents the zone in which the film was conveyed to the drying portion after coating.

(Evaluation of Surface Shape)

The surface shape of the dry coating films so obtained was evaluated through inspection by eye. Symbol ⊚ represents the case where non-uniformity of the surface shape did not at all exist, ○ represents the case where non-uniformity hardly existed, Δ represents the case where non-uniformity existed to a certain extent and X represents the case where non-uniformity existed on the entire coating film surface. Table 2 tabulates the test result.

(Existence of Bubbles)

The resulting dry coating film was cut along a vertical by using a cutter knife, and the existence/absence of bubbles was examined with eye. Symbol ⊚ represents the case where the bubbles did not at all exist, ○ represent the case where the bubbles hardly existed, Δ represents the case where the bubbles were observed to a certain extent and X represents the case where the bubbles occurred on the entire surface. Table 2 tabulates the observation result.

The multi-layer circuit boards obtained by Examples 5 to 8 were excellent in the insulating resistance after the high-temperature high-humidity test for 300 hours, and had also excellent burying property.

The coating films dried under the conditions of Examples 5 to 7 were high quality coating films that did not have solution non-uniformity and coating non-uniformity, were excellent in surface flatness and did not generate the bubbles in the coating films in comparison with Example 8 where the drying time was shortened and Example 9 where the drying temperature was elevated in the drying zones A and B.

PRODUCTION EXAMPLE 3

Five parts of Ketchen Black EC having a primary particle size of 30 nm (product of Ketchen Black International Co.) was blended with 100 parts of a polyethylene terephthalate resin, was mixed inside an extruder and gave a resin film A having a width of 350 mm and a thickness of 50 μm. A resin film B was obtained in the same way as above with the exception that the amount of Ketchen Black EC was changed to 1 part.

A polyethylene terephthalate resin was molded by using an extruder to obtain a resin film C having a width of 350 nm and a thickness of 50 μm.

50 mol % of tetracyclododecene and 50 mol % of 8-methyltetracyclododecene were subjected to ring-opening copolymerization in accordance with the method described in Japanese Unexamined Patent Publication (Kokai) No. 4-363312 and then to hydrogenation reaction to a hydrogenation ratio of 99%, thereby obtaining a ring-opened copolymer hydrogenated product. Next, 28 parts of this ring-opened copolymer hydrogenated product, 12 parts of maleic anhydride and 3 parts of dicumylperoxide were dissolved in 130 parts of t-butylbenzene and were reacted at 140° C. for 6 hours. The solution of the resulting reaction product was poured into 300 parts of methanol and the reaction product was solidified. The reaction product so solidified was vacuum dried at 100° C. for 20 hours to obtain a maleic acid denatured ring-opened polymer hydrogenated product (weight average molecular weight=68,300, glass transition temperature=170° C., maleic acid content=25 mol %).

100 parts of the maleic acid denatured ring-opened polymer hydrogenated product, 50 parts of brominated bisphenol-A type epoxy resin ("Araldite", trademark, product of Asahi-Chiba Co.), 0.1 part of 1-benzyl-2-phenylimidazole, 10 parts of antimony pentoxide and 5 parts of a silicon resin ("Tospearl 120", trademark, product of Toshiba Silicone Co.)

TABLE 2

|  | conveying portion | drying portion | | | evaluation | existence |
| --- | --- | --- | --- | --- | --- | --- |
|  | pre-drying (20° C.) | drying zone A | drying zone B | drying zone C | of surface shape | of bubbles |
| Example 5 | 60 sec | 120 sec (50° C.) | 120 sec (9° C.) | 120 sec (120° C.) | ⊚ | ○ |
| Example 6 | 45 sec | 90 sec (50° C.) | 90 sec (90° C.) | 90 sec (120° C.) | ○ | ○ |
| Example 7 | 30 sec | 120 sec (50° C.) |  | 60 sec (120° C.) | ○ | ○ |
| Example 8 | 15 sec | 30 sec (60° C.) | 30 sec (90° C.) | 30 sec (120° C.) | x | Δ |
| Example 9 | 30 sec | 180 sec (120° C.) | | | x | x | were dissolved in a mixed solvent consisting of 135 parts of xylene and 90 parts of cyclopentanone to obtain a solution of a curable resin composition.

Example 10

After the solution of the curable resin composition described above was filtrated through a "Teflon" (trademark) precision filter having a pore diameter of 3 microns, the solution was applied to the resin film A described above by using a die coater (table coater for study purpose, product of Chugai Oven Industry, Co.), and was dried for 70 seconds inside a drying oven at 50° C., for 70 seconds in a drying oven at 90° C. and for 70 seconds in a drying oven at 120° C. There was thus obtained an insulating material having a 50 μm-thick curable resin composition layer.

On the other hand, a comb-shaped conductor wiring layer having a wiring width and a distance of both 50 microns and a thickness of 18 microns (hereinafter called a "comb-shaped electrode") and a 0.8 mm-thick internal layer board having plating through-holes in 0.2 mm diameter formed therein were washed with a 1 mol/liter aqueous sodium hydroxide solution to remove impurities of the internal layer board, and were then washed with water and dried.

The insulating material obtained in Example 10 was superposed with both surfaces of the internal layer board treated as described above in such a fashion that the curable resin composition layer faced the internal layer board, and was heat-bonded at a temperature of 120° C. and a bonding strength of 5 kgf/cm$^2$ for 10 minutes while using a vacuum laminator to reduce the pressure to 1 mmHg. Next, the resin film was peeled from the insulating material, and the curable resin composition layer was cured at 150° C. to give a multi-layer circuit board.

(Insulating Resistance)

While a DC voltage of 50 V was kept applied to this multi-layer circuit board, the circuit board was left standing in saturated water vapor at 120° C. for 500 hours. Thereafter, the resistance value between the comb-shaped electrodes of the multi-layer circuit board was measured. Symbol A represents the resistance of $10^9$ Ω or more, B represents $10^8$ to less than $10^9$ Ω, C represents less than $10^8$ Ω without short-circuit and D represents short-circuit.

(Withstand Voltage)

The charging voltage was measured at a humidity of 50% and a temperature of 23° C. by using Model 344 electrostatic voltmeter produced by TREK INC.

The film as the object of measurement was gently pushed 10 times by hand on a SUS plate without sliding to frictionally charge the film. Immediately after this operation, the film was arranged in such a fashion as to come into contact with an aluminum plate the back of which was grounded. A measuring probe was brought to a position spaced by 3 mm from the front surface of the film, and the charging voltage was measured at 5 positions on the film surface. The mean value of these measurement values was determined. Table 3 tabulates the evaluation result.

Example 11

An insulating material and a multi-layer circuit board were obtained in the same way as in Example 10 with the exception that the resin film A was replaced by the resin film B. Table 3 tabulates the evaluation result.

Example 12

A voltage of 10 kV was applied to a soft X ray generation tube to generate soft X rays, and the soft X rays were irradiated for 15 seconds to the resin film B described above. Immediately after the irradiation, the curable resin composition solution was applied in the same way as in Example 10 and was dried to give an insulating material and a multi-layer circuit board. Table 3 tabulates the evaluation result.

Example 13

To the resin film B was applied i-isopropanol by using a roll, and the film was dried with air. Immediately after drying with air, a curable resin composition solution was applied in the same way as in Example 10 and was dried to give an

TABLE 3

|  |  | Example 10 | Example 11 | Example 12 | Example 13 | Example 14 |
|---|---|---|---|---|---|---|
| resin film |  | A | B | B | B | C |
| treatment immediately before coating |  | nil | nil | irradiation of soft X ray | alcohol treatment | nil |
| charging voltage of resin film immediately before coating (absolute value V)) |  | 23 | 52 | 7 | 15 | 1030 |
| charging voltage of insulating material (absolute value (V)) |  | 14 | 40 | 2 | 9 | 1270 |
| number of foreign matters | from 10 to less than 30μ | 5 | 8 | 1 | 3 | 250 |
|  | from 30 to 50μ | 0 | 0 | 0 | 0 | 40 |
|  | greater than 50μ | 0 | 0 | 0 | 0 | 0 |
| insulating resistance: 500 hours |  | A | A | A | A | C | insulating material and a multi-layer circuit board. Table 3 tabulates the evaluation result.

Example 14

A curable resin composition solution was coated in the same way as in Example 10 with the exception that the resin film C described above was used as such, and was dried to give an insulating material and a multi-layer circuit board. Table 3 tabulates the evaluation result.

It could be seen from Table 3 that the insulating material the charging voltage of which was limited to 500 V or below could keep high insulating resistance even after the high-temperature high-humidity test for 500 hours in comparison with the insulating material having a high charging voltage (Example 14).

INDUSTRIAL APPLICABILITY

As described above, the invention can provide an insulating material having a curable composition layer in which the amount of foreign matter having particle sizes within the range of 30 to 50 µm is reduced to 0 to 50 pieces per cm². When the insulating material according to the invention is used, miniature wiring, through-holes and via-holes can be formed.

The production method for the insulating material according to the invention can produce an insulating material having a curable composition layer in which the amount of foreign matter having small particle sizes, particularly foreign matter whose particle sizes falls within the range of 30 to 50 µm, can be minimized. Therefore, when the insulating material of the invention is used, it becomes possible to product a multi-layer circuit board excellent in adhesion, burying properties and insulating resistance and having few cracks.

The invention claimed is:

1. A method of producing a multi-layer circuit board having a conductor circuit and an insulating material in which said insulating material is formed in a process comprising curing a curable composition layer,
    wherein said curable composition layer has a content of foreign matter, having particle sizes within the range of 30 to 50 µm, of 0 to 50 pieces per square centimeter;
    wherein the multi-layer circuit board has an electric resistance value of $10^8$ Ω or more when the multi-layer circuit board is left standing at a DC voltage of 50V under a 120° C. saturated water vapor condition for 300 hours;
    wherein the insulating material includes a support and the curable composition layer is laminated on said support, and the insulating material has a charging voltage (absolute value) of not higher than 500 V;
    wherein said process of forming said insulating material comprises steps of forming a coating layer from a solution of a curable composition on said support, drying said coating layer and removing said support, and said step of drying said coating layer includes at least two zones comprising a first drying zone for conducting drying at 20 to 90° C. and a second drying zone for conducting drying at 70 to 150° C., a drying time of each of said drying zones is 40 to 150 seconds, and a temperature of said second drying zone is higher than that of said first drying zone;
    and wherein the method of producing the multi-layer circuit board comprising the steps of:
    laminating said insulating material on an internal layer board having a first electrically insulating layer and an electrically conducting circuit formed on a surface of said first electrically insulating layer in such a fashion that said curable composition layer comes into contact with said internal layer board;
    removing of said support from said curable resin composition layer is by peeling;
    curing said curable composition and forming a second electrically insulating layer; and
    laminating a conductor capable of forming an electrically conducting circuit on said second electrically insulating layer.

2. The method of producing a multi-layer circuit board according to claim 1, wherein said second drying zone includes a third drying zone for conducting drying at 70 to 130° C., and a fourth drying zone for conducting drying at 120 to 150° C., a drying time of each of said drying zones is 40 to 150 seconds, a temperature of said third drying zone is higher than that of said first drying zone, and a temperature of said fourth drying zone is higher than that of said third drying zone.

3. The method of producing a multi-layer circuit board according to claim 2, further comprising a settling step and a pre-drying step before said drying step wherein said coating layer allowed to settle for 10 to 120 seconds, and said settled coating layer is pre-dried at a temperature of 0 to 40° C.

4. A method of forming a multi-layer circuit board comprising a conductor circuit and an insulating material, said method comprising steps of:
    forming said insulating material by
        forming a coating layer from a solution of a curable composition on a support, drying said coating layer, laminating said coating layer to a board comprising said conductor circuit, removing said support, and curing said coating layer to thereby form said insulating material,
    wherein said step of drying said coating layer includes at least two zones comprising a first drying zone for conducting drying at 20 to 90° C. and a second drying zone for conducting drying at 70 to 150° C., a drying time of each of said drying zones is 40 to 150 seconds, and a temperature of said second drying zone is higher than that of said first drying zone;
    wherein said curable composition layer has a content of foreign matter, having particle sizes within the range of 30 to 50 µm, of 0 to 50 pieces per square centimeter, and
    wherein the multi-layer circuit board has an electric resistance value of $10^8$ Ω or more when the multi-layer circuit board is left standing at a DC voltage of 50V under a 120° C. saturated water vapor condition for 300 hours.

5. The method of producing a multi-layer circuit board according to claim 4, wherein said second drying zone includes a third drying zone for conducting drying at 70 to 130° C., and a fourth drying zone for conducting drying at 120 to 150° C., a drying time of each of said drying zones is 40 to 150 seconds, a temperature of said third drying zone is higher than that of said first drying zone, and a temperature of said fourth drying zone is higher than that of said third drying zone.

6. The method of producing a multi-layer circuit board according to claim 5, further comprising a settling step and a pre-drying step before said drying step wherein said coating layer allowed to settle for 10 to 120 seconds, and said settled coating layer is pre-dried at a temperature of 0 to 40° C.

* * * * *